(12) United States Patent
Simopoulos (10) Patent No.: US 6,188,276 B1
(45) Date of Patent: Feb. 13, 2001

(54) POWER AMPLIFIER

(76) Inventor: Anastasios V. Simopoulos, 2 Otis Pratt La., Middleboro, MA (US) 02346

( * ) Notice: Under 35 U.S.C. 154(b), the term of this patent shall be extended for 0 days.

(21) Appl. No.: 09/335,997

(22) Filed: Jun. 18, 1999

Related U.S. Application Data (60) Provisional application No. 60/101,189, filed on Sep. 21, 1998.

(51) Int. Cl.$^7$ ............................. H03F 3/38; H03F 3/217; H03K 7/08
(52) U.S. Cl. ............................. 330/10; 330/251; 375/238
(58) Field of Search ............................. 330/10, 207 A, 330/251, 59; 375/238

(56) References Cited

U.S. PATENT DOCUMENTS

| | | | |
|---|---|---|---|
| 4,217,531 | * 8/1980 | Minalga | 330/86 |
| 5,218,315 | * 6/1993 | Turner | 330/10 |
| 5,311,548 | * 5/1994 | Nikolaus | 375/22 |
| 5,555,301 | 9/1996 | Boike et al. | 379/413 |
| 6,038,265 | * 3/2000 | Pan et al. | 375/238 |

OTHER PUBLICATIONS

Cuk, et al., "A Conceptually New High–Frequency Switched–Mode Power Amplifier Technique Eliminates Current Ripple" (1978).

Lucent Technologies, "L7590 Telephone Ringing Driver" Advance Data Sheet (Sep. 1997).

Motorola, "High Performance Dual Channel Current Mode Controllers" Motorola Analog IC Device Data (1996).

* cited by examiner

*Primary Examiner*—Robert Pascal
*Assistant Examiner*—Patricia T. Nguyen
(74) *Attorney, Agent, or Firm*—Cesari and McKenna (57) ABSTRACT

The invention is a linear converter that operates from a single, unregulated power supply to provide voltage gain and power amplification. The circuit comprises two pulse-width modulators, two switches, and an inductive element, all of which cooperate to maintain an output voltage in fixed proportion to an input signal. According to the invention, an error signal is generated in a resistive divider formed between the input voltage and the output voltage. Excursions of this error signal from two fixed voltage references are used by the pulse-width modulators to generate two pulse-width modulated signals. One pulse-width modulated signal is generated when the error signal is below one voltage reference, and it drives a switch to inductively increase the output voltage. The other pulse-width modulated signal is generated when the error signal is above another voltage reference, and it drives another switch to inductively decrease the output voltage. By continuously feeding back the output voltage to the pulse-width modulators in this manner, a linear power amplifier is realized.

17 Claims, 8 Drawing Sheets

POWER AMPLIFIER

RELATED APPLICATIONS

This application claims the benefit of U.S. Provisional Application No. 60/101,189, filed on Sep. 21, 1998. The disclosure of that application is incorporated rated herein by reference.

FIELD OF INVENTION

The invention relates to power amplifiers, and more particularly to a push-pull switching power amplifier and converter.

BACKGROUND OF THE INVENTION

In a conventional telephone system, a central office provides a ring signal to a telephone set to indicate an incoming call. In response to the ring signal, the telephone set produces intermittent, audible tones. A typical ring signal is powered by a −48 VDC central office power supply, and is delivered as a sequence of 90 Vrms, 20 Hz, signals across the two electrical connections, a "ring" and a "tip," extending from a central office to a telephone handset. This local ring signal must be generated even where digital call signaling is used because telephone sets in a local loop may be designed to respond to the characteristic ring signal. Further, the ring signal is used by some telephone sets to directly drive an electro-mechanical ringing device, which places load requirements on the ring signal generator.

One approach to providing a ring signal is to employ a conventional class D switching power amplifier. These amplifiers are efficient; however, they typically require four switching transistors selectively driven by a pulse-width modulated error signal and two transformers. They are thus relatively large and expensive. Additionally, these amplifiers generally require significant output ripple filtering which adds to cost and complexity. The output filter prevents these amplifiers from passing direct current (DC) signals, which presents a further disadvantage where DC signals are desired.

More specialized circuits have been developed specifically for the generation of analog ring signals from digital inputs. For example, U.S. Pat. No. 5,555,301 describes a circuit for converting digital call signaling. However, this circuit is limited to a uni-polar, approximately square ring signal. Another ring signal generator is described in the data sheet for Lucent Technologies' L7590 Telephone Ringing Driver. This circuit receives as an input a 100 kHz pulse-width modulated signal, which is converted to a ring signal. The L7590 requires two power supplies and an external pulse-width modulator. Further, the maximum output excursion from ground is limited by the negative voltage supplied to the circuit.

There is thus a continuing need for a simple ring signal generator which operates from a single power supply and provides voltage gain and power amplification for an analog ring signal.

SUMMARY OF THE INVENTION

In view of the foregoing, the applicant has devised an improved ring signal generator However, as will be clear from the following description, the invention is more generally an efficient, linear power amplifier with broad potential applications.

The amplifier comprises two pulse-width modulators, two switches, and an inductive element, all of which cooperate to maintain an output voltage in fixed proportion to an input signal. An error signal is generated in a resistive divider formed between the input voltage and the output voltage. The error signal is compared to two fixed voltage references, and the differences are used by the pulse-width modulators to generate two pulse-width modulated signals. One pulse-width modulated signal is generated when the error signal is below one voltage reference, and it drives a switch to inductively increase the output voltage. The other pulse-width modulated signal is generated when the error signal is above another voltage reference, and it drives another switch to inductively decrease the output voltage. By continuously feeding back the output voltage to the pulse-width modulators in this manner, a simple amplifier is realized.

In one embodiment of the invention, the inductive element is a two-terminal inductor In another embodiment, the inductive element is a power transformer having a primary and a secondary winding. One switch is connected to each winding of the transformer such that current pulses may be used to increase or decrease the voltage of the output.

In another aspect of this embodiment, the inductive element is used as an isolation barrier between an input power supply and the voltage output. This topology further employs isolation of the feedback error signal to completely isolate the input stage of the amplifier from the output stage of the amplifier. This embodiment can be further adapted to provide bi-directional control of the output voltage, that is, the control voltage may be provided from either side of the isolation barrier, or from both sides in combination.

The amplifier can be used as a DC/DC converter by supplying a DC input signal. The amplifier can also be used as a ring signal generator to drive a Ringer Equivalent Number load with large signal gain and a characteristic ring signal.

In another embodiment, one of the pulse-width modulators is a variable frequency pulse-width modulator.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
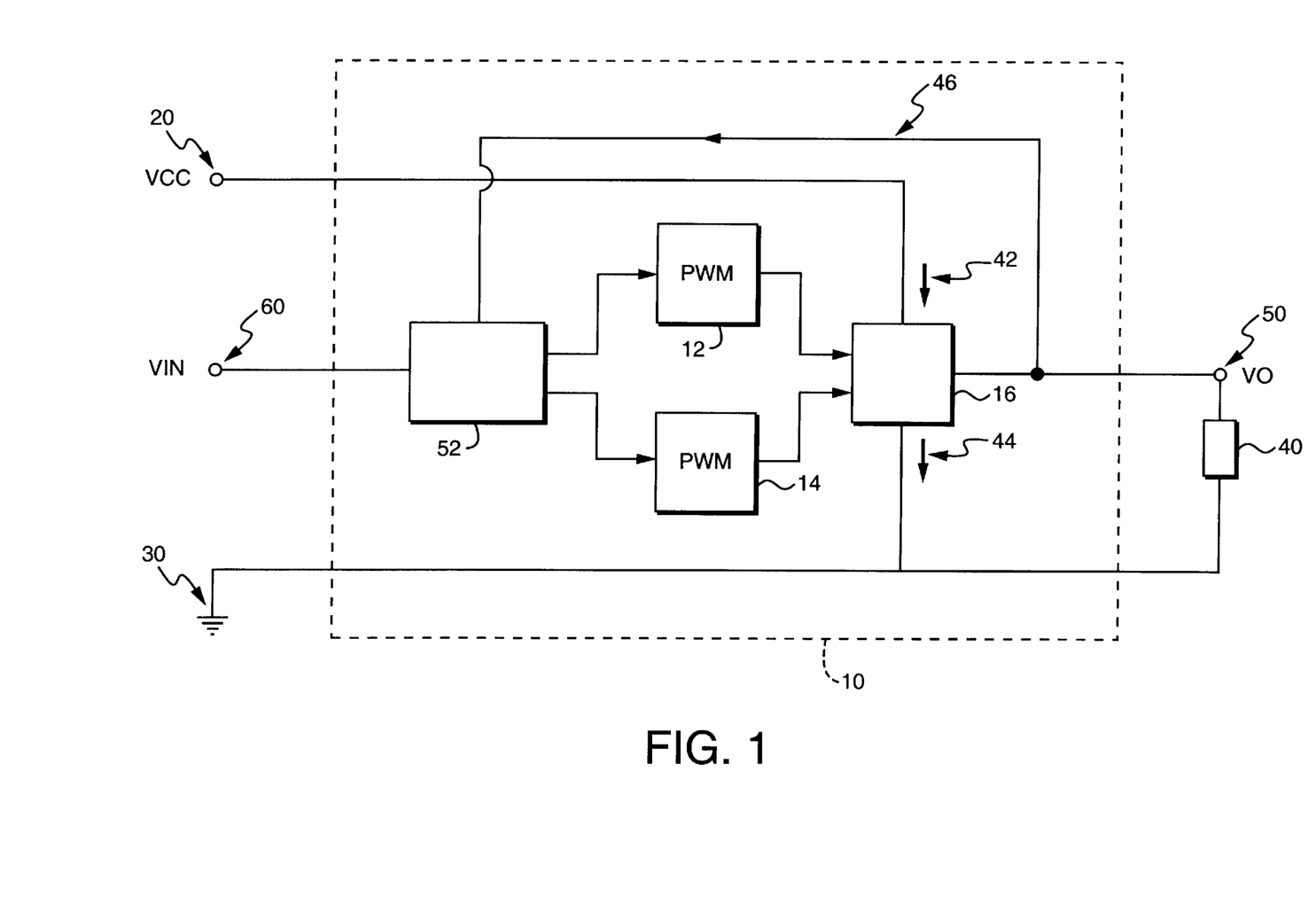
FIG. 1 is a functional block diagram of an amplifier according to the present invention.

FIG. 1 is a block diagram of an amplifier 10 according to the present invention. As seen in FIG. 1, the amplifier 10 includes a first pulse-width modulator and a second pulse-width modulator 14. As is known in the art, a pulse-width modulator produces a digital signal that has a duty cycle indicative of an analog input. Here, two pulse-width modulators 12, 14 are used to selectively couple an inductive element 16 to an unregulated, direct current (DC) power supply 20, and also to selectively couple the inductive element 16 to ground 30. Current is sourced through the inductive element 16 to a load 40 along a path indicated by a first arrow 42, and current is sunk through the inductive element 16 from the load 40 along a path indicated by a second arrow 44. A feedback signal is provided along a lead 46 from the output 50 to a control circuit 52. The control circuit receives the feedback signal 46, and also receives an input signal 60. The control circuit 52 provides signals to the pulse-width modulators 12, 14 in response to the difference between the input signal 60 and the feedback signal from the lead 46 such that a linear relationship is maintained between the input signal 60 and the output signal 50. In short, when the input voltage 60 decreases, the first pulse-width modulator 12 is activated to increase voltage at the output 50 (the output is inverted). When the input voltage 60 increases, the second pulse-width modulator 14 is activated to decrease voltage at the output 50.

The circuit described above is a linear power amplifier. It may be used in power supplies, audio amplifiers, servo actuators, or any other application where an input signal is used to control a voltage applied to a load. The following describes in detail a variety of topologies and applications of the invention.

Figure 2:
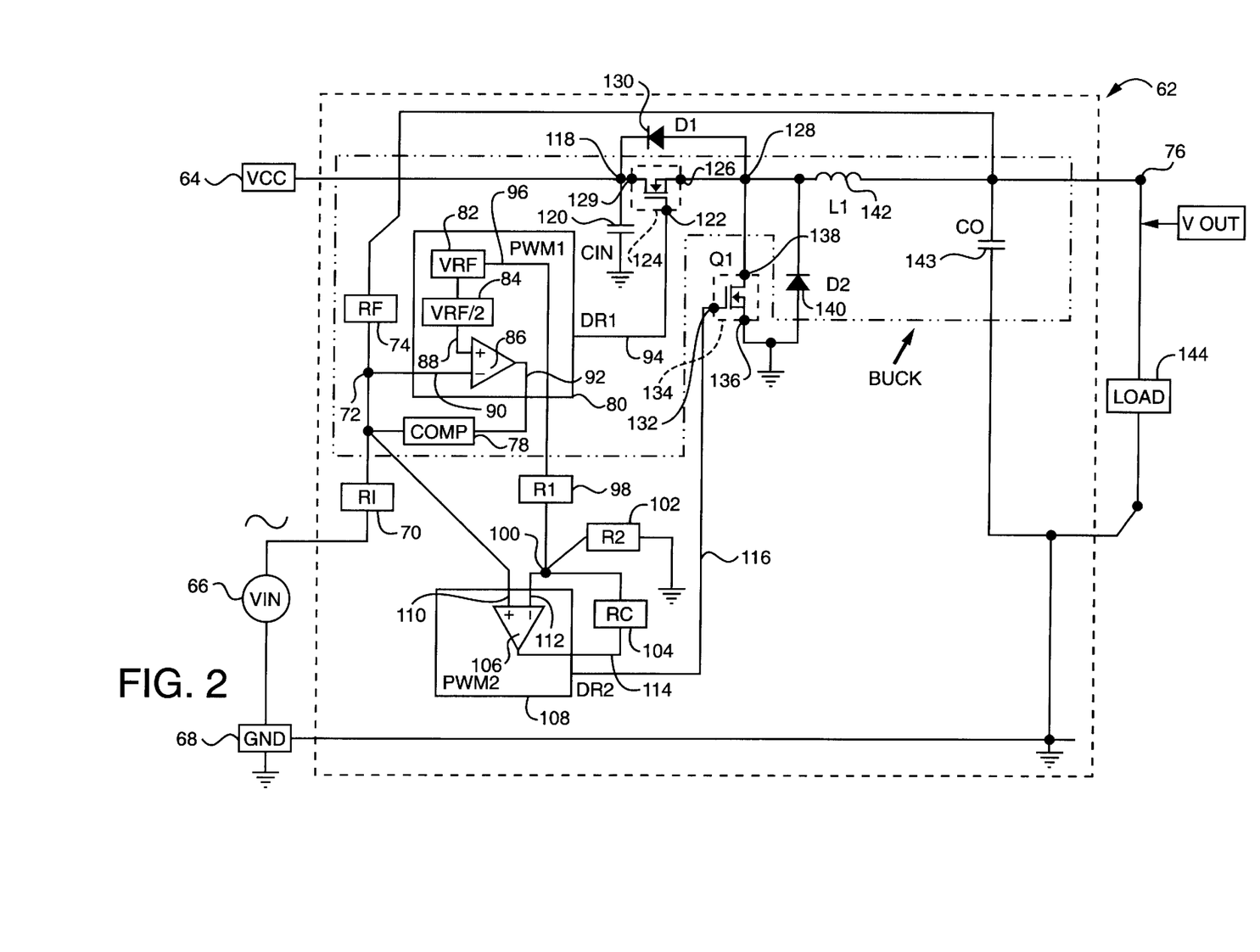
FIG. 2 is a circuit diagram of an amplifier according to the present invention.

FIG. 2 shows a detailed circuit diagram of a simple power amplifier 62 according to the present invention. The inputs to the amplifier 62 are a power source 64, which can be an unregulated DC power source, an input voltage 66, and a ground 68.

An input resistor 70 connects the input voltage 66 to a first node 72. The first node 72 is also connected through a feedback resistor 74 to an output voltage node 76. The first node 72 is further connected, through a resistor-capacitor (RC) feedback circuit 78, to a first pulse-width modulator (PWM) 80. The PWM 80 includes an internal voltage reference 82, preferably derived from the power source 64. Its output is divided in half to provide a second internal voltage reference 84, which is in turn connected to a first error amplifier 86 at a non-inverting input 88. An inverting input 90 of the first error amplifier 86 is connected to the first node 72. An output 92 of the first error amplifier 86 is connected through the RC feedback circuit 78 to the first node 72. When the voltage at the first node 72 is less than the divided internal voltage reference 84, an output 94 of the first PWM 80 carries a pulse-width modulated signal indicative of the difference, or error, between the divided internal voltage reference 84 and the first node 72.

An output 96 of the (undivided) internal voltage reference 82 of the first PWM 80 is connected, through a resistor 98 (R1), to a second node 100. The second node 100 is connected to ground 68 through a resistor 102 (R2), thus establishing a reference voltage at the second node 100 that is a fixed fraction of the output 96 of the internal voltage reference 82. Also connected to the second node 100 is a second RC feedback circuit 104 to a second error amplifier 106 of a second PWM 108. A non-inverting input 110 of the second error amplifier 106 is connected to the first node 72, while an inverting input 112 of the second error amplifier 106 is connected to the second node 100. The output 114 of the second error amplifier 106 is connected to the second RC feedback circuit 104. When the voltage at the first node 72 is greater than the voltage at the second node 100, the output 116 of the second PWM 108 is a pulse-width modulated signal indicative of the voltage difference, or error, between the first node 72 and the second node 100.

It is possible to use equal reference voltages for both PWM's 80, 108, or for example, to use a single voltage reference to establish the voltage at the non-inverting input 88 of the first error amplifier 86 and the inverting input 112 of the second error amplifier 106. However, it is preferred to select resistors 98 (R1) and 102 (R2) such that there is a voltage offset between these inputs 88, 112. This prevents the first PWM 80 and the second PWM 108 from concurrently generating "on" signals to the subsequent switching stage of the amplifier.

The bias for the first PWM 80 and the second PWM 108, although not shown on the circuit diagram of FIG. 2, is provided by the power supply 64, for example through a voltage regulator. The power supply 64 is also connected to a power input node 118, which includes a bypass capacitor 120 between the power input node 118 and ground 68.

The output 94 of the first PWM 80 drives a gate 122 of a first metal oxide semi-conductor conductor field effect transistor (MOSFET) 124. A source 126 of the first MOSFET 124 is connected to a third node 128, and a drain 129 is connected to the power input node 118. A first diode 130 is included with an anode connected to the source 126 and a cathode connected to the drain 129. The output 116 of the second PWM 108 drives a gate 132 of a second MOSFET 134. A source 136 of the second MOSFET 134 is connected to ground 68, and a drain 138 is connected to the third node 128. A second diode 140 is included with an anode connected to the source 136 and a cathode connected to the drain 138. It should be noted that the MOSFET's are well suited to the switching functions of the invention because they have high switching speed and the capacity to carry large currents However, it will be appreciated by those skilled in the art that other switching devices may be used, such as simple field effect transistors or bi-polar junction transistors configured as saturation switches, provided the gates are compatible with the signals from the PWM's, and provided the switches can carry sufficient current for linear amplifier operation.

The selection of the first diode 130 and the second diode 140 is important to the proper operation of the amplifier 62. The switching speed of the diodes 130, 140 should be an order of magnitude higher than the switching frequency at the MOSFET gates 122, 132 The forward voltage drop of the diodes 130, 140 must be less than the forward voltage drop of the parasitic diodes of the MOSFET's 124, 134. Finally, the diodes 130, 140 must have a reverse break down voltage at least as high as the maximum drain to source voltage of the MOSFET's 124, 134.

The amplifier 62 also includes an inductive element 142. The inductive element converts current pulses from the MOSFET's 124, 134 into a voltage at the voltage output node 76. There is a bypass capacitor 143 between the voltage output node 76 and ground 68. A load 144 is connected between the voltage output node 76 and ground 68.

In operation, the MOSFET's 124, 134, under control of the PWM's 80, 108, alternately couple the third node 128 either to ground 68 or to the power supply 64. This creates alternating current pulses through the inductive element 142 which result in voltage pulses across the inductive element 142. The resulting voltage at the voltage output node 76 is supplied to the load 144, and is also fed back to the first node 72 through the feedback resistor 74. By intermittently activating the first MOSFET 124, a buck operation is realized.

By intermittently activating the second MOSFET 134, a boost operation is realized.

The PWM's 80, 108, together with the MOSFET's 124, 134 and the inductive element 142 provide a large open loop voltage gain from the first node 72 to the output node 76. Since, at the same time, the inputs to the error amplifiers 86, 106 are high impedance inputs, the voltage at the output node can be determined by a simple application of Ohm's law to the resistive divider between the voltage output node 76 and the input voltage 66. This approximation will be familiar to designers who work with operational amplifiers or other large gain devices, and yields the following relationship:

$$v_o = \left[\frac{R_i + R_f}{R_i}\right] v_{ref} - \left[\frac{R_f}{R_i}\right] v_i \quad \text{(Eq. 1)}$$

where $v_o$ is the voltage at the voltage output node 76, $v_{ref}$ is the voltage of the divided reference voltage 84, $v_i$ is the voltage at the input voltage 66, $R_i$ is the resistance of the input resistor 70, and $R_f$ is the resistance of the feedback resistor 74.

As should be clear from this relationship, the AC gain of the amplifier 62 can be adjusted through a simple change to the feedback resistor 74. The AC performance of the above circuit depends substantially on the switching speed of the non-linear components, i.e., the PWM's and the MOSFET's. Using PWM's with a switching frequency of five-hundred kilohertz and a twenty volt supply, this topolog demonstrated a −3 dB band width of twenty kilohertz for a fifteen volt, fifteen watt output sine wave. To use the amplifier 62 as a DC/DC converter, a constant input voltage 66 can be supplied. In this case, line and load regulation will similarly depend on the switching speed.

Figure 3:
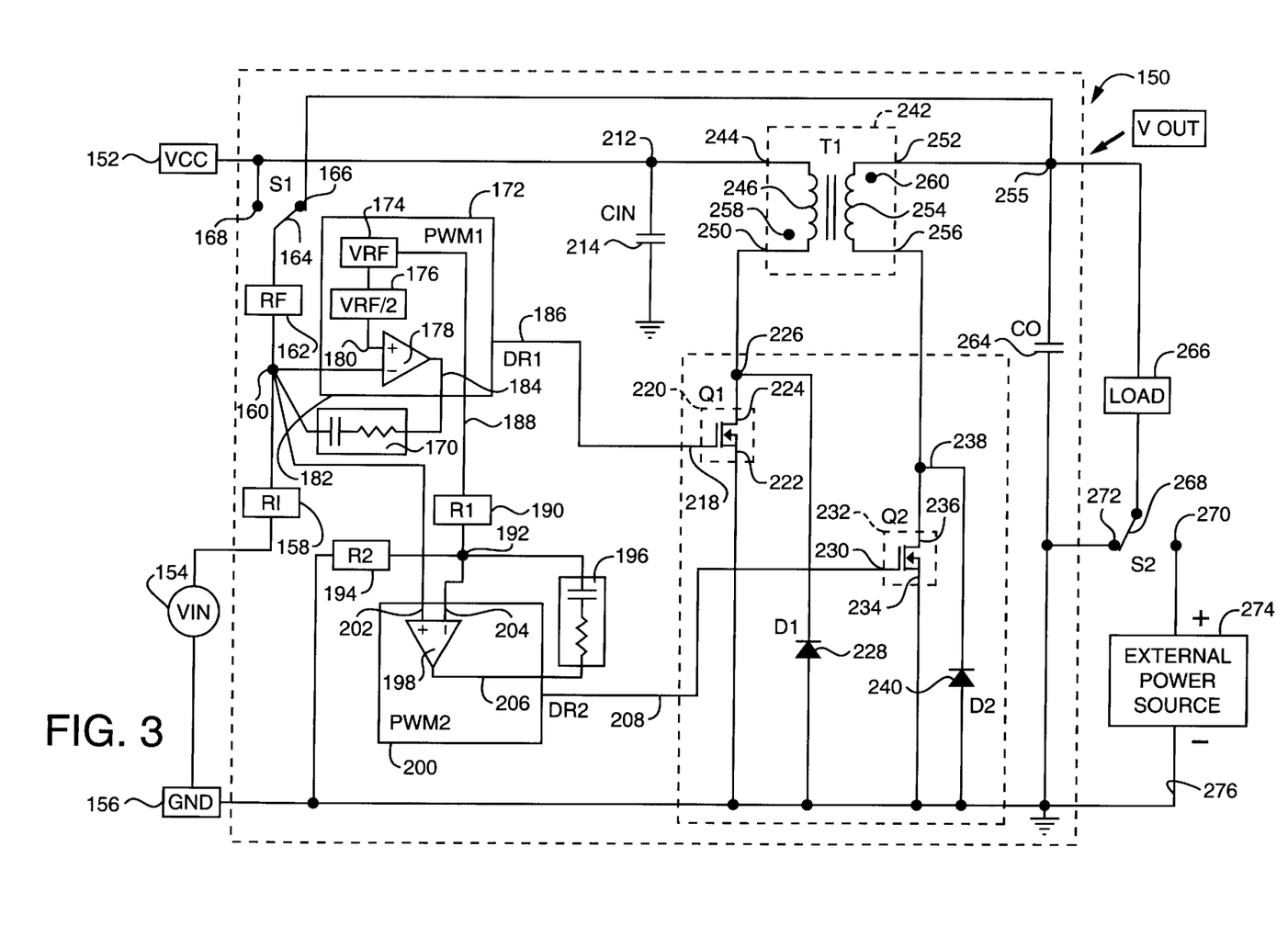
FIG. 3 is a circuit diagram of another amplifier according to the present invention.

FIG. 3 shows a bi-directional amplifier 150 according to the present invention. This amplifier 150 uses a transformer as its inductive element 242 instead of the two-terminal inductive element 142 shown in FIG. 2. The inputs to the amplifier 150 are a power source 152, which can be an unregulated DC power source, an input voltage 154, and a ground 156.

An input resistor 158 connects the input voltage 154 to a first node 160. The first node 160 is connected through a feedback resistor 162 to a first switch 164. The first switch 164 has two poles: a first pole 166 connected to the amplifier output 255, and a second pole 168 connected to the power source 152.

The first node 160 is also connected through a resistor-capacitor (RC) feedback circuit 170 to a first PWM 172. The first PWM 172 includes an internal voltage reference 174, which is divided in half to provide a second internal voltage reference 176, which is connected to a first error amplifier 178 at a non-inverting input 180. An inverting input 182 of the first error amplifier 178 is connected to the first node 160. An output 184 of the first error amplifier 178 is connected through the RC feedback circuit 170 to the first node 160. An output 186 of the first PWM 172 carries a pulse-width modulated signal indicative of the difference, or error, between the divided internal voltage reference 176 and the first node 160.

An output 188 of the (undivided) internal voltage reference 174 of the first PWM 172 is connected, through a resistor 190 (R1), to a second node 192. The second node 192 is connected to ground 156 through a resistor 194 (R2), thus establishing a reference voltage at the second node 192 that is a fixed fraction of the output 188 of the internal voltage reference 174. Also connected to the second node 192 is a second RC feedback circuit 196 to a second error amplifier 198 of a second PWM 200. A non-inverting input 202 of the second error amplifier 198 is connected to the first node 160, while an inverting input 204 of the second error amplifier 198 is the second node 192. The output 206 of the second error amplifier 198 is connected to the second RC feedback circuit 196. An output 208 of the second PWM 200 carries a pulse-width modulated signal indicative of the difference, or error, between the first node 160 and the second node 192. To reduce switching noise, it is preferred to select resistors 190 (R1) and 194 (R2) such that there is an offset between the non-inverting input 180 to the first error amplifier 178 and the ining input 204 of the second error amplifier 198. This prevents simultaneous "on" signals from the first PWM 172 and the second PWM 200.

The bias for the first PWM 172 and the second PWM 200, although not shown on the circuit diagram of FIG. 3, is provided by the unregulated power supply 152, for example through a voltage regulator. The power supply 152 is also connected to a power input node 212, which includes a bypass capacitor 214 between the power input node 212 and ground 156.

The output 186 of the first PWM 172 drives a gate 218 of a first MOSFET 220. A source 222 of the first MOSFET 220 is connected to ground, and a drain 224 is connected to a third node 226. A first diode 228 is included with an anode connected to ground 156 and a cathode connected to the third node 226. The output 208 of the second PWM 200 drives a gate 230 of a second MOSFET 232. A source 234 of the second MOSFET 232 is connected to ground, and a drain 236 is connected to a fourth node 238. A second diode 240 is included with an anode connected to ground 156 and a cathode connected to the fourth node 238.

The amplifier 150 also includes a transformer 242. A first tap 244 of a primary winding 246 of the transformer 242 is connected to the power source 152. A second tap 250 of the primary winding 246 is connected to the third node 226 so that the primary winding 246 can be selectively coupled between ground 156 and the power source 152 by the first MOSFET 220. A first tap 252 of a secondary winding 254 is connected to an amplifier output 255. A second tap 256 of the secondary winding 254 is connected to the fourth node 238 so that the secondary winding 254 can be selectively coupled between ground 156 and the amplifier output 255 by the second MOSFET 232. A pole 258 of the primary winding 246 and a pole 260 of the secondary winding 254 should be connected as shown, i.e., with the polarity of the tap 244 connected to the power supply 152 opposite site the polarity of the tap 252 connected to the amplifier output 255, in order to provide the correct negative feedback to the first node 160.

A bypass capacitor 264 is connected between the amplifier output 255 and ground 156. A load 266 is connected between the amplifier output 255 and a second switch 268. The second switch 268 selectively couples the load 266 to an external power source 274 (at a first pole 270) or to ground 156 (at a second pole 272).

The amplifier 150 is bi-directional, that is the input voltage 154 may be used to control the voltage at the amplifier output 255 using power from the power supply 152, or the input voltage 154 may be used to control the voltage at node 212 (connected to the power supply 152) using power from the external power source 274. In the former mode, the operation of the amplifier 150 is similar to the operation of the simple power amplifier 62, except that the switching currents are applied to opposing windings of the inductive element 242 rather than to a two-terminal inductor. In the latter mode, the first switch 164 is connected to its second pole 168 and the second switch 268 is connected to its first pole 270. In this mode, the voltage at the power input node 212 is fed back to the first node 160 and the inductive element 242 uses the external power source 274 to provide a large open loop gain from the first node 160 to the power input node 212. Whether the amplifier is used in the first or second mode, the voltage gain from the input to the output can be determined from Eq. 1, above.

Figure 4:
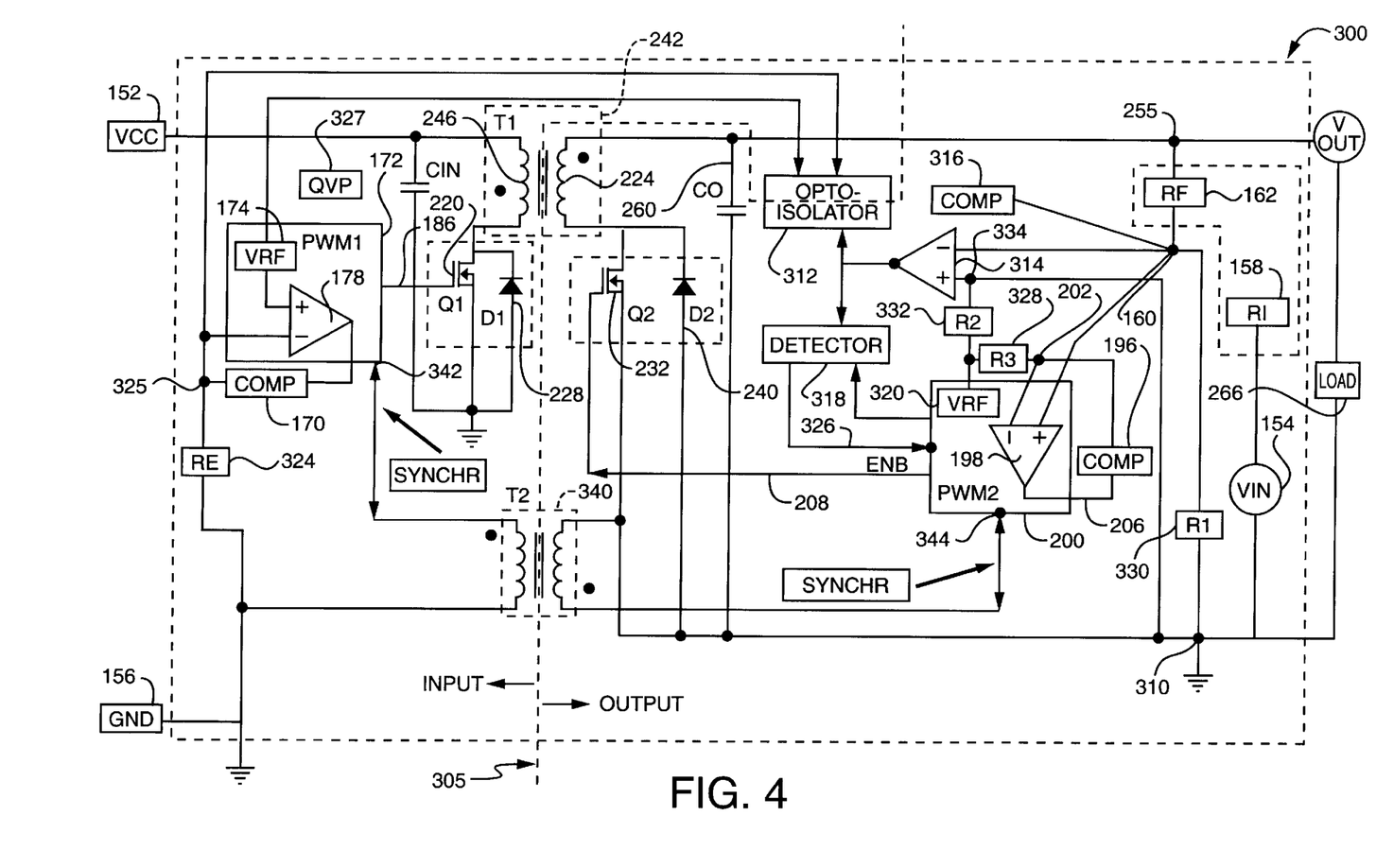
FIG. 4 is a circuit diagram of an isolation amplifier according to the present invention.

FIG. 4 shows an isolation amplifier according to the present invention. This isolation amplifier 300 is similar to the amplifier 150 of FIG. 3, with the differences as described below to achieve an isolation barrier 305 between the power supply 152 and the load 266. The output stage of the amplifier has a separate ground 310.

The isolation amplifier 300 includes an opto-isolator 312, an external error amplifier 314 with compensation 316, a voltage detector 318, and a voltage reference 320 in the second PWM 200. The isolation amplifier 300 receives an isolated negative feedback through the opto-isolator 312 as follows. The opto-isolator 312 receives a bias current from the reference voltage 174 of the first PWM 172. An output 322 of the external error amplifier 314 provides an input current to the opto-isolator 312, which the opto-isolator 312 converts to an output current. This output current passes through a biasing resistor 324 to generate a voltage at an input node 325 to the first PWM 172. The output 322 from the external error amplifier 314 is also connected to the voltage detector 318 so that the second PWM 200 can be selectively enabled, using an enable input 326, only when the output from the external error amplifier 314 has a voltage higher than the voltage reference 320 of the second PWM 200. It will be appreciated that the threshold of the voltage detector 318 may be trimmed to obtain a desired time-wise separation between the activation of the first PWM 172 and the second PWM 200.

In operation, the isolation amplifier 300 uses the voltage at the first node 160, which is the resistively divided voltage between the amplifier output 255 and the input voltage 154, to control the PWM's 172, 200. When the input voltage 154 decreases, the voltage at the first node 160 decreases below it's equilibrium value, i.e., the voltage at the amplifier output 255 is too small. As a result, the voltage at the output 322 of the external error amplifier 314 increases, and this is inverted by the opto-isolator 312 to produce a lower input voltage to the first PWM 172 at the input node 325. The first PWM 172 then generates a pulse stream to the first MOSFET 220, which produces current pulses through the primary winding 246 of the transformer 242 resulting in increased voltage at the amplifier output 255.

Conversely, when the voltage at the first node 160 is higher than the inverting node 202 of the second PWM's error amplifier 198, the second PWM 200 is enabled. It responsively generates a pulse stream to the second MOSFET 232, which produces current pulses through the secondary winding 224 of the transformer 242 resulting in a decreased voltage at the amplifier output 255. It is noted that in this latter state, power is transferred back to the power supply 152. While this feature increases efficiency, it requires the addition of over-voltage protection 327 for the input stage circuitry.

The voltage reference 320 for the second PWM 200 is provided to the inverting input 202 of the error amplifier 198 through a resistor 328. The voltage reference 320 is also provided to the external error amplifier 314 by a network consisting of a resistor 330 (R1) and a resistor 332 (R2). These resistors 330, 332 establish an offset between a divided voltage node 334 and the inverting input 202 of the second error amplifier 198. When the voltage of the first node 160 is between these two voltages, neither PWM 172, 200 is active.

The isolation amplifier 300 also includes a synchronization transformer 340. Using the synchronization transformer 340, an output 342 based upon an oscillator (not shown) from the first PWM 172 can be used to synchronize the oscillator from the second PWM 200 across the isolation barrier 305. This control is bi-directional and either PWM 172,200 can provide the synchronization signal. It will be appreciated that the PWM's 172,200 can operate without this synchronization, however, the PWM's 172, 200 will generate less noise when modulated with synchronized oscillators.

Figure 5:
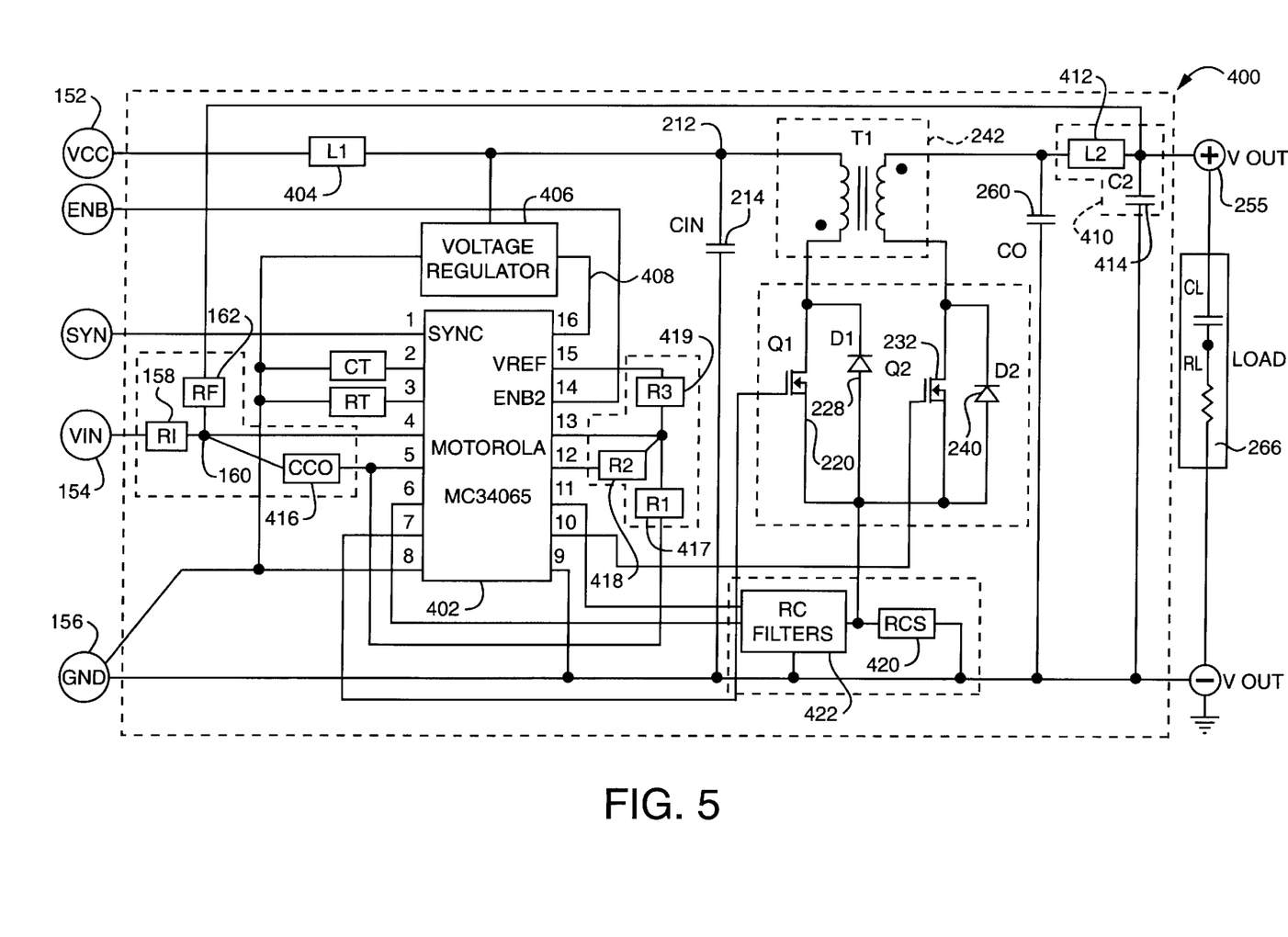
FIG. 5 is a circuit diagram of a ring signal generator according to the present invention.

FIG. 5 shows a detailed circuit diagram of the present invention configured as a ring signal generator 400. In this circuit, a MOTOROLA MC34065 is used as a pulse-width modulator 402. The MC34065 is a dual channel current mode pulse-width modulator well suited to the invention. The ring signal generator operates according to the previously described circuits, with the following modifications.

The unregulated power supply 152 receives further conditioning through a supply inductor 404. This conditioned input at the node 212 is passed through a voltage regulator 406 to provide a regulated supply voltage 408 to the PWM 402. The voltage regulator 406 may be a linear regulator, switching regulator, or other supply regulator compatible with the PWM 402. The ring signal generator 400 has an output filter 410 comprising a filter inductor 412 in series with a filter capacitor 414. Loop compensation for a first internal ternal error amplifier (not shown) is provided by the addition of a compensating capacitor 416 from the first node 160 to pin 5 of the PWM 402. An inverting input for the first internal PWM is provided at pin 4, as shown. An output of the first error amplifier (pin 5) drives an input resistor 417 (R1) of a second internal error amplifier (not shown) in a second internal PWM, with the second amplifier configured as a unity gain inverting amplifier. Its inverting input is provided at pin 13 and its output is at pin 12. The output is fed back to the input through a feedback resistor 418 (R2). An internal voltage reference (not shown) is provided at pin 15. A biasing resistor 419 (R3) provides a DC offset to the inverting input at pin 13 using the reference voltage at pin 15. Further signal conditioning is provided to conform the circuit to the manufacturer's specifications for the PWM 402. This includes a current sense resistor 420 between the source of the MOSFET's 220, 232 and ground 156, along with RC filters 422 to condition the sensed current for input to pins 6 and 11 of the PWM 402.

The ring signal generator 400 operates to achieve the transfer function recited in Eq. 1. Using components for the PWM 402 as specified by the manufacturer, the ring signal generator 400 can be used to drive a Ringer Equivalent Number (approximately 75 $\mu$F in series with 1 k$\Omega$) with a 200 V peak-to-peak, 100 Hz sinusoid from a 10 V peak-to-peak input.

Figure 6:
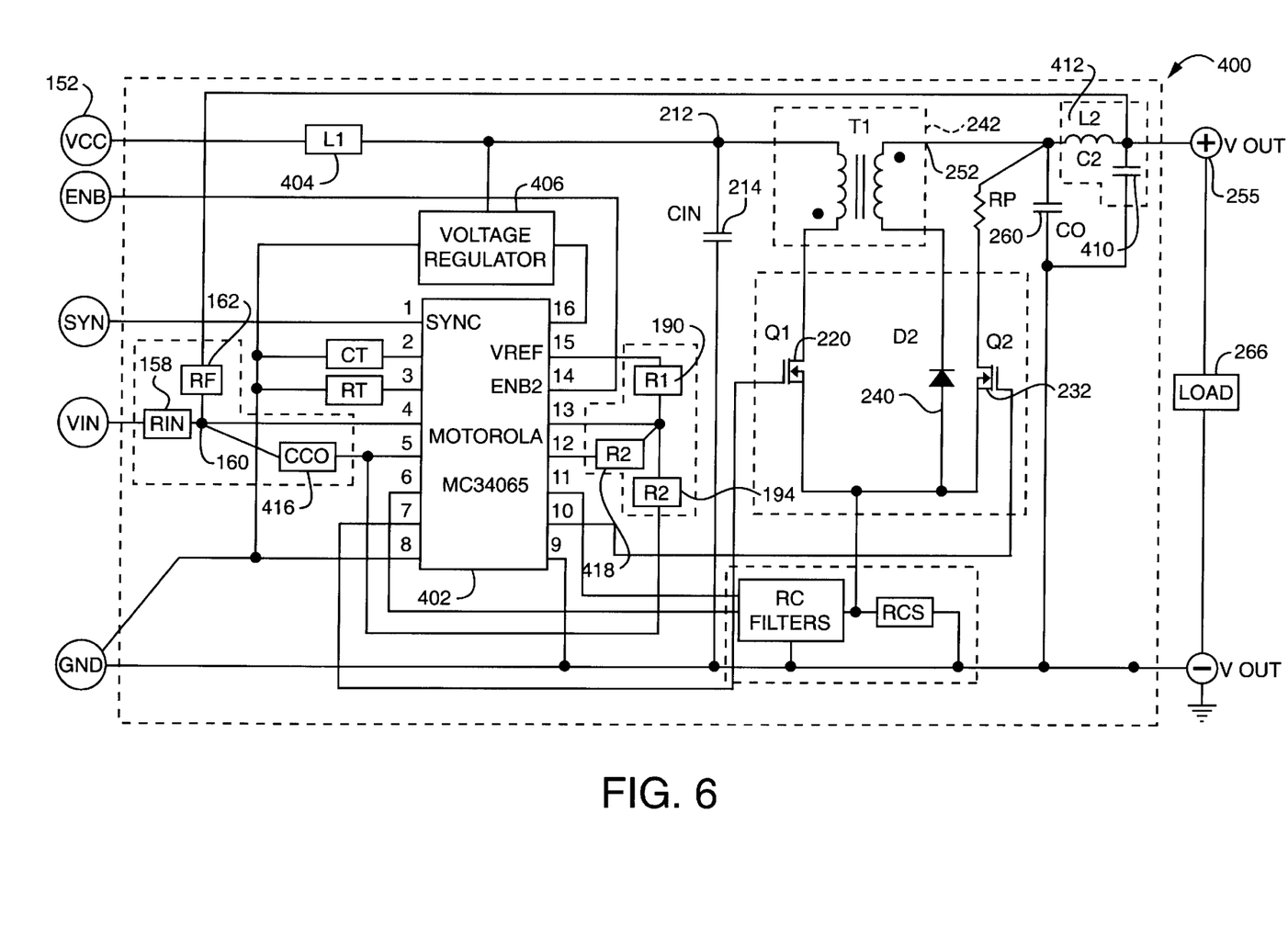
FIG. 6 is a circuit diagram of another ring signal generator according to the present invention.

FIG. 6 shows another embodiment of the ring signal generator 400. This embodiment eliminates the diode 228. The drain of the second MOSFET 232 is connected, through a resistor 438, to the first tap 252 of the secondary winding 254 of the transformer 242. As a result of this arrangement, power is dissipated from the load directly through a power resistor 438 and the second MOSFET 232. This embodiment places greater power demand on the unregulated power supply 152, while saving hardware costs.

Figure 7:
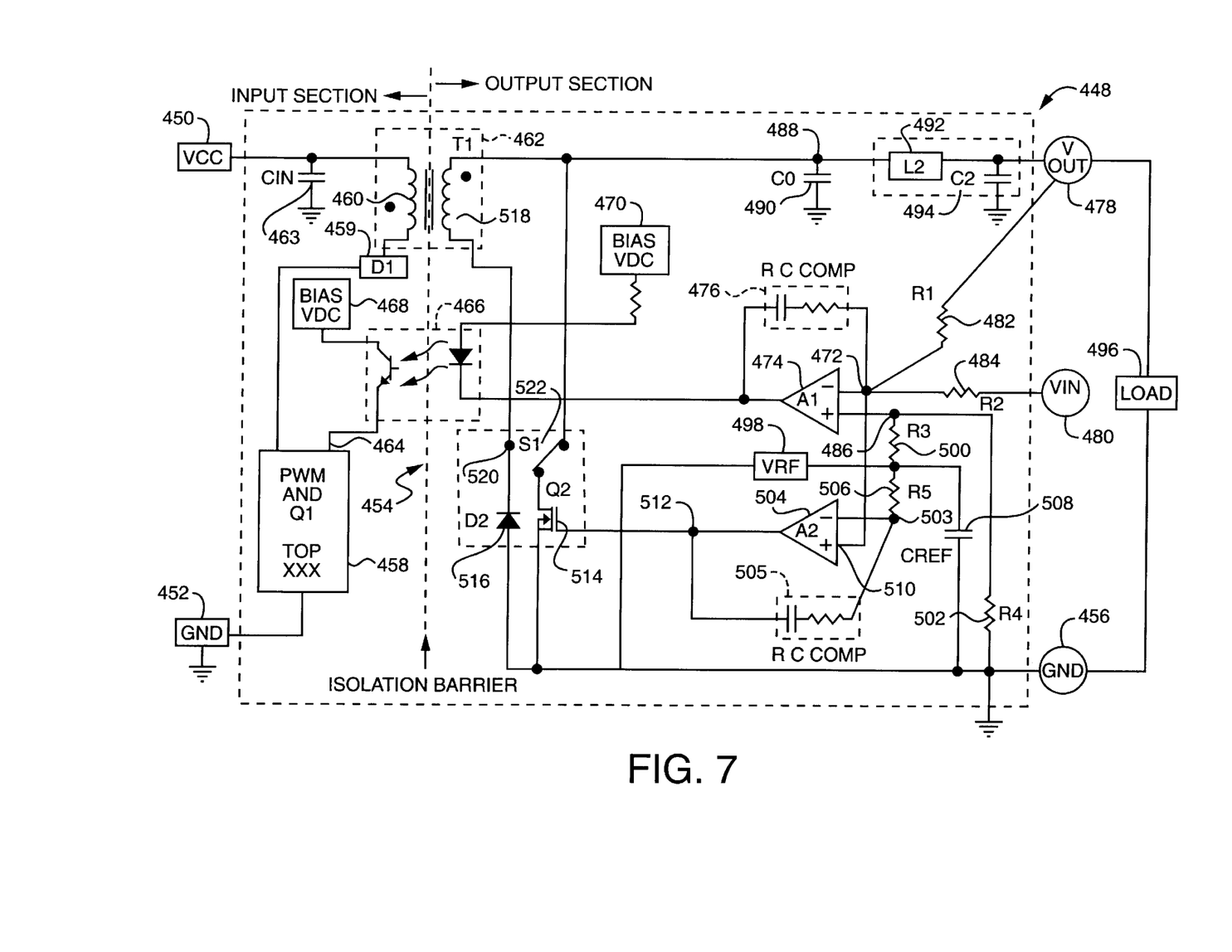
FIG. 7 is a circuit diagram of an amplifier according to the present invention using variable-frequency pulse-width modulation.

FIG. 7 shows another amplifier 448 according to the present invention in which one of the pulse width modulators is replaced by a single error amplifier. As used herein, the term "pulse-width modulator" is intended to include this topology, which provides variable frequency pulse-width modulation of a given input voltage.

The circuit of FIG. 7 operates from a power supply 450, which can be an unregulated DC supply. A ground 452 is provided on the power supply 450 side of an isolation barrier 454, and another ground 456 is provided on the output side of the isolation barrier 454. A pulse-width modulator with an integrated switch 458 controls the flow of current through a first diode 459 (D1) and a primary winding 460 of a transformer 462. The voltage output of the power supply 450 is conditioned by a capacitor 463. An input 464 to the pulse-width modulator 458 is controlled by an opto-isolator 466. The opto-isolator receives biasing from a first reference 468 on one side of the isolation barrier 454, and from a second reference 470 on the other side of the isolation barrier 454. The voltage at the input 464 to the pulse-width modulator 458 is controlled by the voltage at a feedback node 472, as buffered by an error amplifier 474 with feedback compensation 476.

The voltage at the feedback node 472 is determined by a combination of a voltage at an output 478 and a voltage at an input 480 through a resistive divider formed by a first resistor 482 (R1) and a second resistor 484 (R2). In operation, when the voltage at the input 480 decreases, and the voltage at the feedback node 472 accordingly falls below the voltage at a first node 486, the pulse-width modulator 458 produces current pulses through the primary winding 460 of the transformer 462. This increases the voltage at node 488. After conditioning through a first output capacitor 490, an output inductor 492, and a second output capacitor 494, this results in an increase of the voltage applied to a load 496 at the output 478.

A voltage reference 498 is resistively divided between a third resistor 500 (R3) and a fourth resistor 502 (R4) to provide a constant voltage at the first node 486. The voltage reference 498 is also provided, through a fifth resistor 506 (R5) to an inverting input 503 of a second error amplifier 504 (with current established through RC compensation network 505). A bypass capacitor 508 (Cref) is connected between the voltage reference 498 and ground 456.

When the voltage at the input 480 increases, the circuit 448 has a different mode of operation. The resulting increase in voltage at the feedback node 472 will raise a non-inverting input 510 of the second error amplifier 504 above the inverting input 503, thus generating a positive voltage at an output 512 of the second error amplifier 504. This positive voltage activates a switch 514 which decreases the voltage at the output 478. A second diode 516 (D2) is connected between ground 456 and a secondary winding 518 of the transformer 462. It should be noted that the switch 514, which is shown connected between ground 456 and the node 488, may optionally be connected between ground and a cathode 520 of the second diode 516 using a second switch 522. In this case, the first diode 459 (D1) is required because power is transferred from the output 478 back to the power supply 450.

The circuit maintains a linear relationship between the voltage at the input 480 and the voltage at the output 478. The relationship is similar to that of Eq. 1, except that the voltage at the first node 486 is derived from the voltage reference 498 through the resistive divider comprising the third resistor 500 (R3) and the fourth resistor 502 (R4). Thus the effective reference voltage is:

$$v = v_{ref}\left[\frac{R_4}{R_3 + R_4}\right] \quad (Eq. 2)$$

and the complete relationship of the output to the input is:

$$v_o = \left[\frac{R_4}{R_3 + R_4}\right]\left[\frac{R_1 + R_2}{R_2}\right]v_{ref} - \left[\frac{R_1}{R_2}\right]v_i \quad (Eq. 3)$$

where
$v_o$ is the voltage at the output 478,
$v_{ref}$ is the voltage of the voltage reference 498,
$v_i$ is the voltage at the input 480, and
$R_1$–$R_4$ are as shown in FIG. 7.

Figure 8:
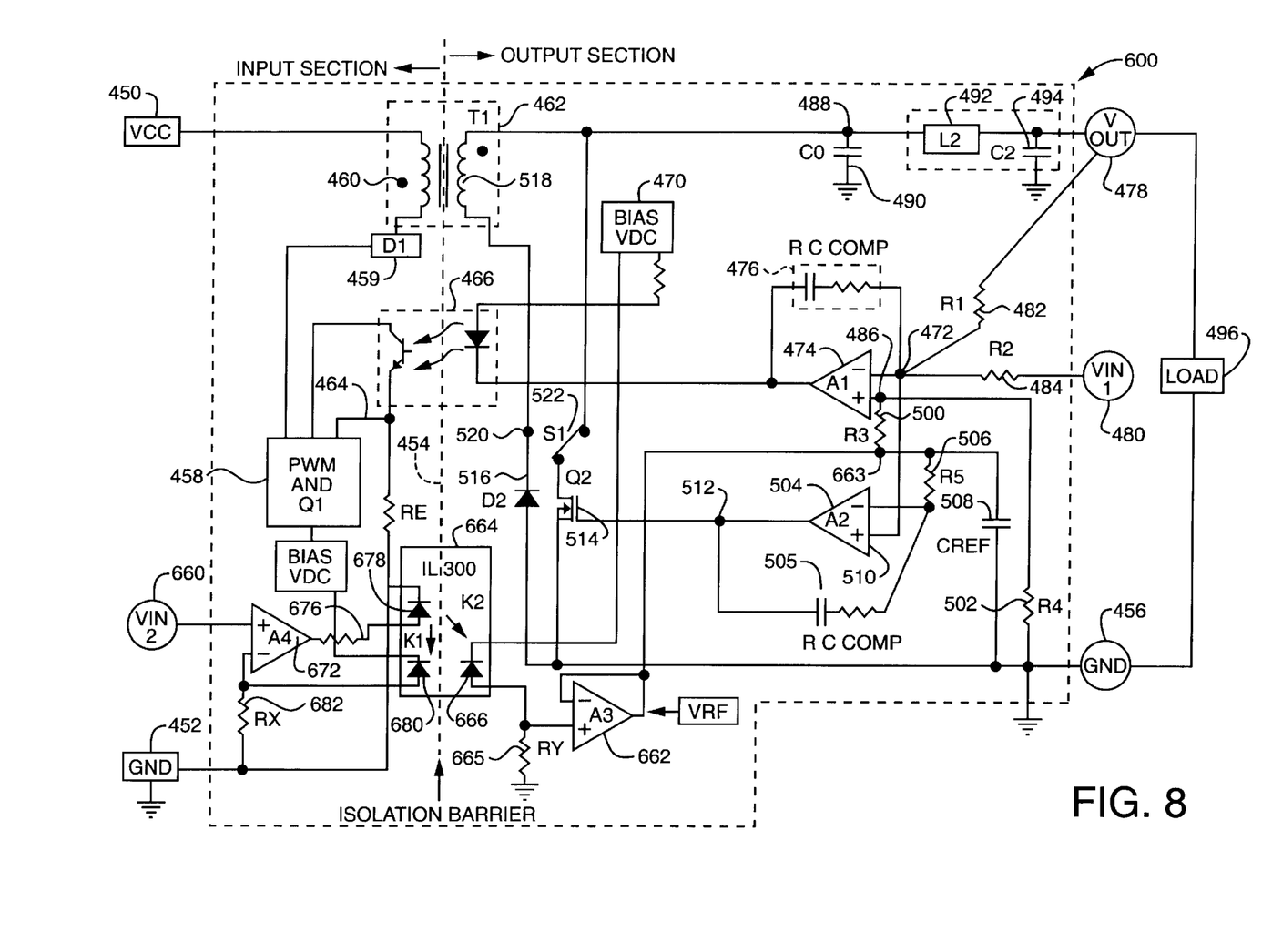
FIG. 8 is a circuit diagram of an amplifier according to the present invention with bi-directional control of the output.

FIG. 8 shows an amplifier 600 according to the present invention. It is similar to the amplifier of FIG. 7, with the addition of bi-directional control of the voltage at the output 478. To achieve bi-directional control, the fixed voltage reference 498 of FIG. 7 is replaced with a voltage derived from a second input 660. The output of a buffer 662 establishes a voltage at a node 663, which provides a reference voltage for the remaining circuitry. In the circuit of FIG. 8, a second opto-isolator 664 is used to maintain the isolation barrier 454 between the power supply 450 and the output 478.

A sixth resistor 665 (Ry) provides a ground path for current from a first diode 666. The current through the first diode 666 is proportional to the current passing from a third amplifier 672 through an output resistor 676 and through a second diode 678. A proportional current is also established through a third diode 680, and a seventh resistor 682 (Rx) provides a path to ground for this current. The current through the third diode 680 establishes feedback for linear operation of the third amplifier 672. By feeding back current in this manner, good thermal stability can be maintained between the voltage at the second input 660 and the voltage at the node 663. The effective voltage reference at the node 663 is:

$$v = v_2\left[\frac{R_y}{R_x}\right] \quad (Eq. 4)$$

and the complete relationship between the inputs and the output is:

$$v_o = \left[\frac{R_y}{R_x}\right]\left[\frac{R_4}{R_3 + R_4}\right]\left[\frac{R_1 + R_2}{R_2}\right]v_2 - \left[\frac{R_1}{R_2}\right]v_1 \quad (Eq. 5)$$

where
$v_o$ is the voltage at the output 478,
$v_1$ is the voltage of the input 480,
$v_2$ is the voltage at the second input 660, and
$R_1$–$R_4$, $R_x$, are as shown in FIG. 8.

Although the present invention has been shown and described with respect to several preferred embodiments thereof, it should be understood by those skilled in the art that various other changes, omissions and additions to the form and detail thereof may be made therein without departing from the spirit and scope of the invention.

What is claimed is:

1. A power amplifier having a ground, a voltage input, a power supply input, and a voltage output, the circuit comprising:

an input resistor connected between the voltage input and a feedback node;

a feedback resistor connected between the voltage output and the feedback node;

the feedback node coupled to a first pulse-width modulator, the first pulse-width modulator generating a first pulse-width modulated signal when the feedback node has a voltage lower than a first voltage reference, the first pulse-width modulated signal periodically activating a first switch, the first switch inductively coupling the voltage output to the power supply input; and the feedback node coupled to a second pulse-width modulator, the second pulse-width modulator generating a second pulse-width modulated signal when the feedback node has a voltage higher than a second voltage reference, the second pulse-width modulated signal periodically activating a second switch, the second switch inductively coupling the voltage output to ground.

2. The power amplifier of claim 1 wherein the second switch inductively couples the voltage output to ground through a secondary winding of a transformer, and wherein the first switch inductively couples the power supply to ground through a primary winding of the transformer.

3. The power amplifier of claim 2 wherein the power amplifier is an isolation amplifier further comprising an opto-isolator between the voltage output and the first pulse-width modulator.

4. The power amplifier of claim 2 wherein the power amplifier is a bi-directional power amplifier further comprising an external power source selectively coupled to the voltage output, the feedback resistor being coupled to the feedback node and selectively coupled to the power supply input.

5. The power amplifier of claim 2 wherein one of the pulse-width modulators is a variable frequency pulse-width modulator.

6. The power amplifier of claim 2 further comprising a second voltage input, wherein an output voltage at the voltage output is determined by a linear combination of a first voltage at the voltage input and a second voltage at the second voltage input.

7. The power amplifier of claim 1 wherein the first switch and the second switch are metal oxide semiconductor field effect transistors.

8. The power amplifier of claim 1 wherein the voltage input is coupled to a constant voltage reference, thereby establishing a constant voltage at the voltage output.

9. A power amplifier having a ground, a voltage input, a power supply input, and a voltage output, the circuit comprising:

means for resistively coupling the voltage input to a feedback node;

means for resistively coupling the voltage output to the feedback node;

means for providing a first voltage reference and a second voltage reference;

means for converting a voltage at the feedback node to two pulse-width modulated signals, a first pulse-width modulated signal indicative of the voltage difference between the feedback node and the first voltage reference, and the second pulse-width modulated signal indicative of the voltage difference between the second voltage reference and the feedback node;

means for inductively converting the first pulse-width modulated signal into an increase in voltage of the voltage output; and means for inductively converting the second pulse-width modulated signal into a decrease in voltage of the voltage output.

10. The power amplifier of claim 9 further comprising means for isolating the voltage input and the power supply from the voltage output.

11. The power amplifier of claim 9 further comprising means for bi-directionally supplying plying power between the voltage output and the power supply input.

12. The power amplifier of claim 9 further comprising means for bi-directionally controlling a voltage at the voltage output.

13. A method for converting an input voltage to an output voltage, the method comprising the steps of:

a) providing a power supply;

b) providing the input voltage to a feedback node through an input resistor;

c) providing the output voltage to the feedback node through a feedback resistor;

d) providing a first voltage reference and the voltage at the feedback node to a first pulse-width modulator to produce a first pulse-width modulated signal indicative of the difference between the first voltage reference and the voltage at the feedback node;

e) providing a second voltage reference and the voltage at the feedback node to a second pulse-width modulator to produce a second pulse-width modulated signal indicative of the difference between the voltage at the feedback node and the second voltage reference;

f) providing the first pulse-width modulated signal to a first switch;

g) inductively coupling the voltage output to the power supply through the first switch when the first pulse-width modulated signal is in a first state;

h) providing the second pulse-width modulated signal to a second switch; and i) inductively coupling the voltage output to ground through the second switch when the second pulse-width modulated signal is in a second state.

14. The method of claim 13, the step of inductively coupling the voltage output to ground further comprising the step of coupling the voltage output to ground through the secondary winding of a transformer and the step of inductively coupling the voltage output to the power supply further comprising the step of coupling the voltage output to the power supply through the primary winding of a transformer.

15. The method of claim 13 further comprising the step of coupling the voltage output to the feedback node through an opto-isolator.

16. The method of claim 13 wherein the step of providing the input voltage further comprises the step of providing a constant input voltage.

17. The method of claim 13 further comprising the step of providing a second input voltage, the second input voltage controlling a first voltage of the first voltage reference and a second voltage of the second voltage reference.

* * * * *